United States Patent [19]

Ollendick

[11] Patent Number: 4,575,859

[45] Date of Patent: Mar. 11, 1986

[54] RECEIVER FOR DIGITAL SIGNALS

[75] Inventor: Gary B. Ollendick, Mundelein, Ill.

[73] Assignee: AT&T Teletype Corporation, Skokie, Ill.

[21] Appl. No.: 592,483

[22] Filed: Mar. 23, 1984

[51] Int. Cl.$^4$ ............................................... H03K 5/08
[52] U.S. Cl. ...................................... 375/76; 307/268; 307/573
[58] Field of Search ................... 375/76; 358/166, 167; 307/464, 350, 354, 358, 268, 573, 572; 328/164; 330/252, 253, 259, 277, 278, 279

[56] References Cited

U.S. PATENT DOCUMENTS

| | | | |
|---|---|---|---|
| 3,602,735 | 8/1971 | Lodi | 307/268 |
| 3,657,568 | 4/1972 | Dargent | 307/268 |
| 4,182,963 | 1/1980 | Yamada et al. | 307/358 |

Primary Examiner—Benedict V. Safourek
Attorney, Agent, or Firm—W. K. Serp; A. A. Tirva

[57] ABSTRACT

A digital receiver (40) includes a differential amplifier (42) providing data signal E and a control signal F. The level of the control signal F is related to the average level of the data signal E. A slicing circuit 44 includes series connected transistors (46, 48), the gates of which receive the data signal E. A third transistor (52) is connected to provide hysteresis to the slicing circuit, and a fifth transistor (54) is connected in parallel with the third transistor (52). The control electrode of the transistor (52) receives the control signal F from the differential amplifier (42).

4 Claims, 4 Drawing Figures

RECEIVER FOR DIGITAL SIGNALS

TECHNICAL FIELD

This invention relates to a receiver for digital signals which includes a slicing circuit having means for automatically adjusting its slicing level to accommodate changes in the average level of the input signal to the slicing circuit.

BACKGROUND OF THE INVENTION

The reception and regeneration of digital signals occurs in transmission systems wherein the signals are received from a remote location. The ability of the signal receiver to adjust to environmental conditions, which include temperature, voltage and component processing variations, is limited thus restricting the signal voltage range over which the receiver will operate satisfactorily. In practice, the operating range of the receiver is narrow since the first stage in the receiver is often an analogue device such as a differential amplifier particularly susceptible to environmental conditions. Prior receivers include a slicing circuit such as a Schmidt trigger. Slicing circuits have predetermined switching levels selected to accommodate anticipated nominal signal conditions. Such slicing circuits often have hysteresis characteristics which provide a certain amount of noise immunity to incoming signals which are within the design range of the circuit. When the input signal to the slicing circuit exhibits a large variation in its average level, the operating range of prior circuits is exceeded; and the regenerated output signal is often distorted. Thus, in prior receivers, environmental conditions such as temperature variations, power supply fluctuations and components processing characteristics must be closely controlled to assure that the receiver will satisfactorily handle reasonable anticipated signal level excursions.

THE DRAWINGS

DETAILED DESCRIPTION

Prior Art

Figure 1:
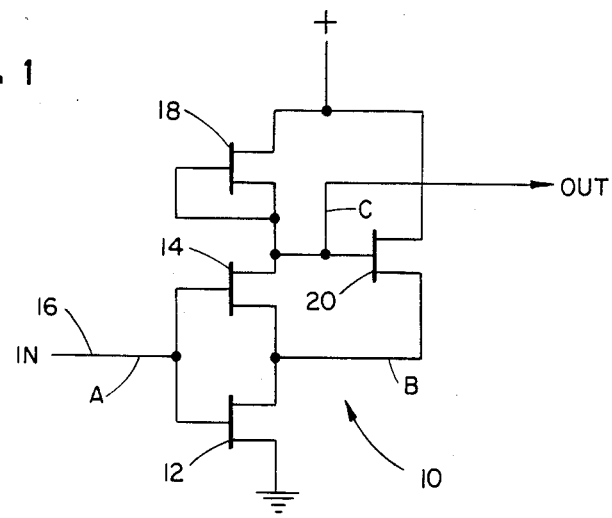
FIG. 1 is a schematic diagram of a prior art slicing circuit.

To provide a clearer understanding of the present invention, a prior art slicing circuit 10 is illustrated in FIG. 1. The circuit 10 includes a pair of series connected input transistors 12 and 14 with their gate electrodes commonly connected forming an input node 16. The input node 16 receives an input signal A. The source electrode of the transistor 12 is connected to a common terminal of a supply source (not shown); and the drain electrode of the transistor 14 is connected, through a load resistor 18 (implemented with a depletion mode transistor), to the positive terminal of the supply source. A third transistor 20 provides circuit hysteresis. The gate electrode of the third transistor 20 is connected to the junction of the load resistor 18 and the drain electrode of the transistor 14. The drain/source electrodes of the third transistor 20 are connected from the positive terminal of the supply source to the common junction of the source/drain electrodes of the transistors 14 and 12. The signal at the source electrode of the transistor 20 is designated B, and an output signal C is taken from the gate electrode of the third transistor 20.

Figure 2:
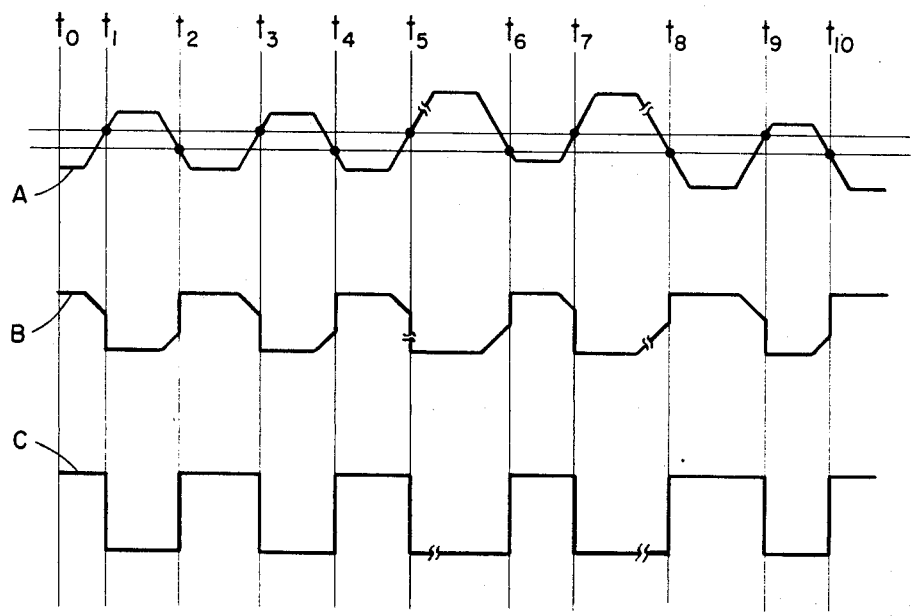
FIG. 2 is an illustration of selected signal levels of the prior art circuit of FIG. 1 during exemplary operating conditions.

Referring to FIG. 2, at t0, the input signal A is low; transistors 12 and 14 are off and transistor 20 is on. Since transistor 12 is off, there is no current flow through transistor 20 nor through any other portion of the circuit 10. As the input voltage A starts to rise, the threshold voltage of transistor 12 is exceeded; and transistor 12 conducts causing voltage level B to fall. At t1, the modified threshold voltage of transistor 14 is reached. This transistor abruptly conducts, and the output voltage C quickly falls turning off transistor 20 which further lowers the voltage at the source electrode of transistor 14 causing the transistor to quickly saturate. The transistor 20 draws current for a short time interval starting with the conduction of current through transistor 12 and ending when the modified threshold voltage of transistor 14 is reached.

As the input voltage A starts to fall, transistor 12 increases in resistance and the voltage level B starts to rise. The resistance of transistor 14 also starts to increase; and at t2, transistor 14 abruptly turns off. This condition turns transistor 20 on with both voltage levels B and C rapidly rising. It will be appreciated that voltage C switches from high to low and low to high in response to different levels of the input voltage A thus providing a hysteresis condition. The voltage level B generally determines the required input voltage level A at which transistors 12 and 14 are switched. The characteristics of the various transistors 12, 14 and 20 are selected to provide switching at the nominal voltage levels of the expected incoming signal A.

The condition of input signal A, from t0 to t5, is nominal and generates a symmetrical output signal C during this time interval. When the average value of the incoming signal A rises to the level shown between time intervals t5-t8, the level of the input signal A turns transistor 12 off at t6 and on again at t7. The level of the input signal A, at which switching takes place, is fixed by the circuit components selected to accommodate nominal signal conditions. Due to the upward bias of the signal A, switching occurs at different positions on the wave shape. Thus, the output signal C becomes nonsymmetrical. That is, the circuit slicing levels selected for nominal conditions produce a distorted signal when the average value of the input signal A varies from nominal. When the average level of the incoming signal A falls below the nominal signal for which the circuit components have been selected i.e. during time interval t8-t10, the output signal C is distorted. Thus, the prior art circuitry of FIG. 1, in response to the input signal A, will provide a distorted output signal C as the average value of the input signal A deviates from its nominal value.

Illustrated Embodiment

Figure 3:
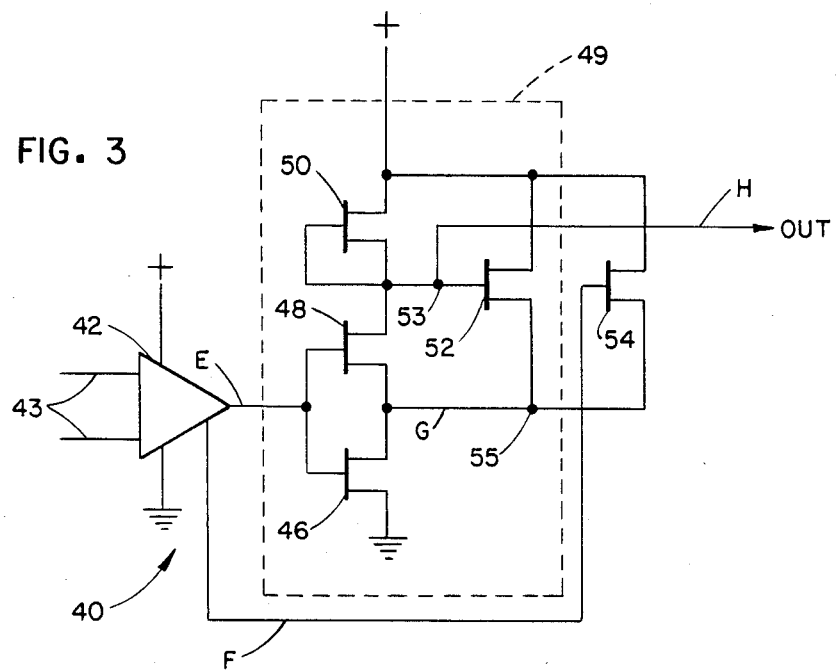
FIG. 3 is a schematic diagram of a digital receiver including certain features of this invention.

With reference to FIG. 3, a digital receiver 40 is illustrated including a differential amplifier 42 receiving a signal at its balanced inputs 43. The incoming signal may be generated, at its source, by a differential driver (not shown). The differential amplifier 42 cancels common input signal conditions and amplifies only the incoming signal excursions without introducing direct current bias to an output signal E. The average level of the output signal E is determined by environmental conditions such as temperature variations, power supply fluctuations and component processing. Additionally, the differential amplifier 42 provides a direct current control signal F, the level of which is proportional to the average value of the output signal E. Such a differential amplifier for producing both the output signal E and the direct current control signal F is shown in FIG. 2 of an article written by Y. P. Tsividis, D. L. Fraser, Jr., and J. E. Dziak entitled "A Process-Insensitive High-Performance NMOS Operational Amplifier", IEEE Journal of Solid-State Circuits, Vol. SC-15, No. 6, pp. 921–928, December 1980. As will be subsequently considered, the control signal F is used to automatically adjust the switching levels of a slicing circuit 44.

The signal E, of the differential amplifier 42, is fed to the input of the level slicing circuit 44 which includes first and second transistors 46 and 48 and a resistor 50 implemented by a suitably biased depletion mode transistor. The portion of the slicing circuit 44, enclosed by the broken outline 49, is similar to the prior art circuit of FIG. 1. A feedback transistor 52 is connected from the positive terminal of a power supply (not shown) to the common source/drain junction of the transistors 46 and 48. A control transistor 54 is connected across the positive terminal of the power source and a control node 55. The gate electrode of the transistor 54 is connected to the control signal output F of the differential amplifier 42. The transistor 54 raises and lowers the voltage level at the node 55 and, thus, influences the effective switching level of the transistor 48. In this way, the slicing circuit 44 accommodates to changes in the average level of the differential amplifier output signal E. For example, as the average value of the output signal of the amplifier increases, the slicing level of the circuit will also increase.

Figure 4:
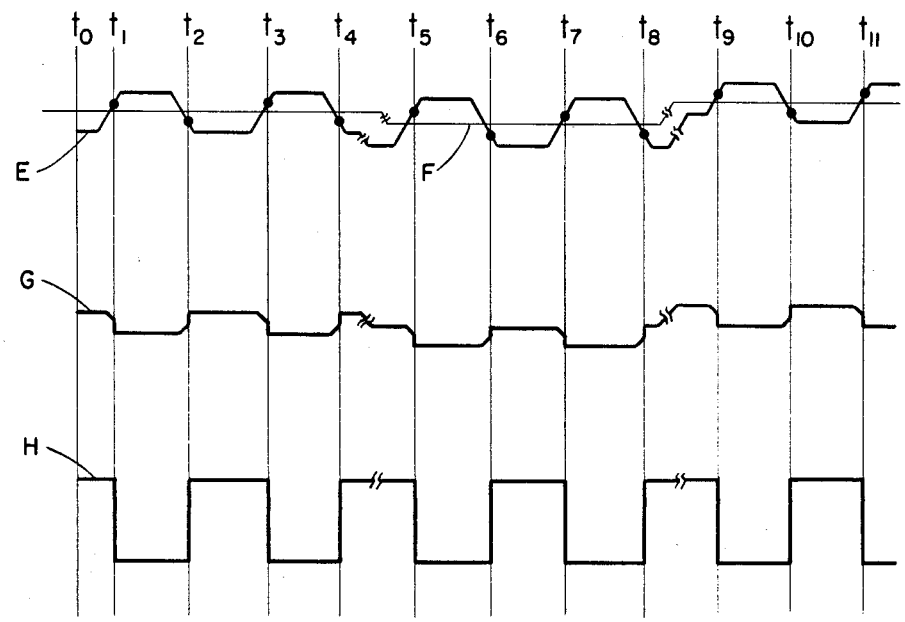
FIG. 4 is an illustration of selected signal levels of the digital receiver of FIG. 3 during exemplary operating conditions.

As shown in FIG. 4, the output signal E to the slicing circuit 44 is shown exhibiting a variation in the average direct current value of the signal. A nominal signal condition exists during t0–t4, and the average level of the signal is below nominal during the time interval t5–t8 and above nominal during t9–t11. The control signal F is also illustrated superimposed on the signal E. The control signal F follows the variations in the average value of the signal E. The average level of the feedback signal G, at the control node 55, follows the average level of the control signal F from the differential amplifier 42. It will be appreciated that at any instant of time, the voltage difference between the average value of the input voltage E and the voltage G at node 55 remains relatively constant. Thus, the modified threshold voltage of transistor 48 is reached at approximately the same location on the input signal E wave shape regardless of the average level of the input signal E. Due to this characteristic, the circuit 40 generates a symmetrical data signal H at the output as determined by the information content of the input signal E.

Although this invention has been particularly shown and described with reference to a preferred embodiment thereof, it will be understood that various changes in form and detail may be made without departing from the scope and spirit of the invention as defined by the following claims:

What is claimed is:

1. A receiver for digital signals comprising:
   a differential amplifier (42) receiving a digital signal and providing first (E) and second (F) output signals, said first output signal (E) varying in relation to said digital signal and said second output signal (F) being related to the average level of said first output signal (E);
   a slicing circuit (44) having first and second input transistors (46, 48) with the control electrodes of said first and second transistors (46, 48) commonly connected to said first output signal E from said differential amplifier (42), one electrode of said first transistor (46) being connected to a first terminal of a supply source and one electrode of said second transistor (48) being connected through a load device (50) to a second terminal of said supply source, and the remaining electrodes of said first and second transistors (46, 48) being connected together to provide a control node (55);
   a third transistor (52) connected across said control node (55) and said second supply source terminal, the control electrode of said third transistor (52) being connected to the junction of said load device (50) and said second transistor (48), said control electrode of said third transistor providing a data output signal (H); and
   a means (54) connected between said second power source terminal and said control node (55) and responsive to said second output signal (F) of said differential amplifier (42) for influencing the voltage level (G) of said control node (55).

2. The circuit of claim 1 wherein said influencing means comprises:
   a fourth transistor (54) connected between said second power source terminal and said control node (55), the control electrode of said fourth transistor (54) is connected to said second output of said differential amplifier (42).

3. The circuit of claim 2 wherein said fourth transistor (54) is controlled by said second output signal (F) and said fourth transistor (54) controls the voltage (G) at said control node (55) directly in proportion to the level of said second control signal (F) so that the voltage differential between said first control signal (E) and the signal (G) at said control node (55) is relatively constant over the anticipated variations in the average level of said first control signal (E).

4. The circuit of claim 3 wherein said load device (50) is implemented by a biased transistor.

* * * * *